(12) United States Patent
Keeth

(10) Patent No.: US 6,912,680 B1
(45) Date of Patent: Jun. 28, 2005

(54) MEMORY SYSTEM WITH DYNAMIC TIMING CORRECTION

(75) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 854 days.

(21) Appl. No.: 08/798,227

(22) Filed: Feb. 11, 1997

(51) Int. Cl.⁷ .............................................. G11C 29/00
(52) U.S. Cl. ........................ 714/736; 714/735; 713/401
(58) Field of Search ................................ 711/100, 142, 711/167, 141, 169, 147; 326/93; 395/551, 552; 370/503, 507; 710/60, 25, 58, 36; 713/401, 400, 503, 600, 500; 365/194; 714/716, 735, 736, 750; 376/93

(56) References Cited

U.S. PATENT DOCUMENTS

| | | | |
|---|---|---|---|
| 3,633,174 A | 1/1972 | Griffin | |
| 4,004,100 A | 1/1977 | Takimoto | |

(Continued)

FOREIGN PATENT DOCUMENTS

| | | |
|---|---|---|
| EP | 0 171 720 A2 | 2/1986 |
| EP | 0 295 515 A1 | 12/1988 |
| EP | 0 406 786 A1 | 1/1991 |
| EP | 0 450 871 A2 | 10/1991 |
| EP | 0 476 585 A3 | 3/1992 |
| EP | 0 655 741 A2 | 5/1995 |
| EP | 0 655 834 A1 | 5/1995 |
| EP | 0 680 049 A2 | 11/1995 |
| EP | 0 703 663 A1 | 3/1996 |
| EP | 0 704 848 A2 | 4/1996 |
| EP | 0 704 975 A1 | 4/1996 |
| EP | 0 767 538 A1 | 4/1997 |
| JP | 6-1237512 | 10/1986 |
| JP | 2-112317 | 4/1990 |
| JP | 4-135311 | 8/1992 |
| JP | 5-136664 | 1/1993 |
| JP | 5-282868 | 10/1993 |
| JP | 0-7319577 | 12/1995 |
| WO | WO 94/29871 | 12/1994 |
| WO | WO 95/22200 | 8/1995 |
| WO | WO 95/22206 | 8/1995 |
| WO | WO 96/10866 | 4/1996 |
| WO | WO 97/14289 | 4/1997 |
| WO | WO 97/42557 | 11/1997 |

OTHER PUBLICATIONS

Alvarez, J. et al. "A Wide–Bandwidth Low Voltage PLL for PowerPC™ Microprocessors" IEEE IEICE Trans. Electron., vol. E–78. No. 6, Jun. 1995, pp. 631–639.

(Continued)

Primary Examiner—B. James Peikari
(74) Attorney, Agent, or Firm—Dorsey & Whitney, LLP

(57) ABSTRACT

A memory system includes a memory controller and a bank of memory devices. The memory controller controls the memory devices through packets of control data and a master clock signal. Each of the memory devices includes an adjustable output timing vernier that can be adjusted in response to commands from the memory controller. The vernier output controls timing of output data relative to the master clock signal. As each memory device transmits data to the memory controller, the memory device also transmits an echo clock signal coincident with the data. The memory controller receives the echo clock signal and compares the echo clock signal to the master clock signal to identify shifts in timing of the echo clock signal. If the echo clock signal shifts by more than one vernier increment from the master clock signal, the master controller issues a command to the memory device to adjust the output vernier to correct the timing drift of the echo clock signal. By correcting the timing drift of the echo clock signal, the memory controller also corrects timing drift of the output data, thereby assuring that the data arrive at the memory controller coincident with edges of the master clock signal.

24 Claims, 6 Drawing Sheets

U.S. PATENT DOCUMENTS

| | | |
|---|---|---|
| 4,077,016 A | 2/1978 | Sanders et al. |
| 4,096,402 A | 6/1978 | Schroeder et al. |
| 4,404,474 A | 9/1983 | Dingwall |
| 4,481,625 A | 11/1984 | Roberts et al. |
| 4,508,983 A | 4/1985 | Allgood et al. |
| 4,511,846 A | 4/1985 | Nagy et al. |
| 4,514,647 A | 4/1985 | Shoji |
| 4,524,448 A | 6/1985 | Hullwegen |
| 4,573,017 A | 2/1986 | Levine |
| 4,600,895 A | 7/1986 | Landsman |
| 4,603,320 A | 7/1986 | Farago |
| 4,638,187 A | 1/1987 | Boler et al. |
| 4,638,451 A | 1/1987 | Hester et al. |
| 4,687,951 A | 8/1987 | McElroy |
| 4,727,541 A | 2/1988 | Mori et al. |
| 4,746,996 A * | 5/1988 | Furuhata et al. ............... 386/91 |
| 4,773,085 A | 9/1988 | Cordell |
| 4,789,796 A | 12/1988 | Foss |
| 4,818,995 A | 4/1989 | Takahashi et al. |
| 4,893,087 A | 1/1990 | Davis |
| 4,902,986 A | 2/1990 | Lesmeister |
| 4,953,128 A | 8/1990 | Kawai et al. ................ 365/194 |
| 4,958,088 A | 9/1990 | Farah-Bakhsh et al. |
| 4,972,470 A | 11/1990 | Farago |
| 4,984,204 A | 1/1991 | Sato et al. ............. 365/189.11 |
| 4,984,255 A | 1/1991 | Davis et al. |
| 5,020,023 A * | 5/1991 | Smith .......................... 710/61 |
| 5,038,115 A | 8/1991 | Myers et al. |
| 5,062,082 A | 10/1991 | Choi ..................... 365/230.06 |
| 5,075,569 A | 12/1991 | Branson |
| 5,086,500 A | 2/1992 | Greub |
| 5,087,828 A | 2/1992 | Sato et al. |
| 5,120,990 A | 6/1992 | Koker |
| 5,122,690 A | 6/1992 | Bianchi |
| 5,128,560 A | 7/1992 | Chern et al. |
| 5,128,563 A | 7/1992 | Hush et al. |
| 5,130,565 A * | 7/1992 | Girmay ....................... 327/175 |
| 5,134,311 A | 7/1992 | Biber et al. |
| 5,150,186 A | 9/1992 | Pinney et al. |
| 5,165,046 A | 11/1992 | Hesson |
| 5,168,199 A * | 12/1992 | Huffman et al. ............. 315/370 |
| 5,179,298 A | 1/1993 | Hirano et al. |
| 5,182,524 A * | 1/1993 | Hopkins ..................... 330/149 |
| 5,194,765 A | 3/1993 | Dunlop et al. |
| 5,212,601 A | 5/1993 | Wilson |
| 5,220,208 A | 6/1993 | Schenck |
| 5,223,755 A | 6/1993 | Richley |
| 5,229,929 A * | 7/1993 | Shimizu et al. ................ 363/98 |
| 5,233,314 A | 8/1993 | McDermott et al. |
| 5,233,564 A | 8/1993 | Ohshima et al. ....... 365/230.05 |
| 5,239,206 A | 8/1993 | Yanai |
| 5,243,703 A | 9/1993 | Farmwald et al. |
| 5,254,883 A | 10/1993 | Horowitz et al. |
| 5,256,989 A | 10/1993 | Parker et al. |
| 5,257,294 A | 10/1993 | Pinto et al. |
| 5,268,639 A | 12/1993 | Gasbarro et al. |
| 5,272,729 A | 12/1993 | Bechade et al. |
| 5,274,276 A | 12/1993 | Casper et al. |
| 5,276,642 A | 1/1994 | Lee ....................... 365/189.04 |
| 5,278,460 A | 1/1994 | Casper |
| 5,281,865 A | 1/1994 | Yamashita et al. |
| 5,283,631 A | 2/1994 | Koerner et al. |
| 5,289,580 A | 2/1994 | Latif et al. |
| 5,295,164 A | 3/1994 | Yamamura |
| 5,304,952 A | 4/1994 | Quiet et al. |
| 5,311,481 A | 5/1994 | Casper et al. .......... 365/230.06 |
| 5,311,483 A | 5/1994 | Takasugi .................... 365/233 |
| 5,313,431 A | 5/1994 | Uruma et al. .......... 365/230.05 |
| 5,315,269 A | 5/1994 | Fujii |
| 5,315,388 A | 5/1994 | Shen et al. |
| 5,321,368 A | 6/1994 | Hoelzle |
| 5,337,285 A | 8/1994 | Ware et al. .................. 365/227 |
| 5,341,405 A | 8/1994 | Mallard, Jr. |
| 5,347,177 A | 9/1994 | Lipp |
| 5,347,179 A | 9/1994 | Casper et al. |
| 5,355,391 A | 10/1994 | Horowitz et al. |
| 5,361,002 A | 11/1994 | Casper |
| 5,367,649 A | 11/1994 | Cedar |
| 5,379,299 A | 1/1995 | Schwartz |
| 5,390,308 A | 2/1995 | Ware et al. |
| 5,400,283 A | 3/1995 | Raad .......................... 365/203 |
| 5,402,389 A | 3/1995 | Flannagan et al. .......... 365/233 |
| 5,408,640 A | 4/1995 | MacIntyre et al. |
| 5,410,263 A | 4/1995 | Waizman |
| 5,416,436 A | 5/1995 | Rainard |
| 5,416,909 A | 5/1995 | Long et al. |
| 5,420,544 A | 5/1995 | Ishibashi |
| 5,424,687 A | 6/1995 | Fukuda |
| 5,428,311 A | 6/1995 | McClure |
| 5,428,317 A | 6/1995 | Sanchez et al. |
| 5,430,408 A | 7/1995 | Ovens et al. |
| 5,430,676 A | 7/1995 | Ware et al. |
| 5,432,823 A | 7/1995 | Gasbarro et al. |
| 5,438,545 A | 8/1995 | Sim |
| 5,440,260 A | 8/1995 | Hayashi et al. |
| 5,440,514 A | 8/1995 | Flannagan et al. |
| 5,444,667 A | 8/1995 | Obara ......................... 365/233 |
| 5,446,696 A | 8/1995 | Ware et al. |
| 5,448,193 A | 9/1995 | Baumert et al. |
| 5,451,898 A | 9/1995 | Johnson |
| 5,457,407 A | 10/1995 | Shu et al. |
| 5,465,076 A | 11/1995 | Yamauchi et al. .......... 331/179 |
| 5,473,274 A | 12/1995 | Reilly et al. |
| 5,473,575 A | 12/1995 | Farmwald et al. |
| 5,473,639 A | 12/1995 | Lee et al. |
| 5,485,490 A | 1/1996 | Leung et al. |
| 5,488,321 A | 1/1996 | Johnson |
| 5,489,864 A | 2/1996 | Ashuri ........................ 327/161 |
| 5,497,127 A | 3/1996 | Sauer |
| 5,497,355 A | 3/1996 | Mills et al. ............. 365/230.08 |
| 5,498,990 A | 3/1996 | Leung et al. |
| 5,500,808 A | 3/1996 | Wang |
| 5,502,672 A | 3/1996 | Kwon .................... 365/189.05 |
| 5,506,814 A | 4/1996 | Hush et al. |
| 5,508,638 A | 4/1996 | Cowles et al. |
| 5,513,327 A | 4/1996 | Farmwald et al. |
| 5,515,403 A | 5/1996 | Sloan et al. |
| 5,532,714 A | 7/1996 | Knapp et al. |
| 5,539,345 A | 7/1996 | Hawkins |
| 5,544,124 A | 8/1996 | Zagar et al. ............ 365/230.08 |
| 5,544,203 A | 8/1996 | Casasanta et al. .......... 375/376 |
| 5,550,515 A | 8/1996 | Liang et al. |
| 5,550,783 A * | 8/1996 | Stephens et al. ............. 365/233 |
| 5,552,727 A | 9/1996 | Nakao |
| 5,555,429 A | 9/1996 | Parkinson et al. |
| 5,557,224 A | 9/1996 | Wright et al. |
| 5,557,781 A | 9/1996 | Stones et al. |
| 5,563,546 A | 10/1996 | Tsukada |
| 5,568,075 A | 10/1996 | Curran et al. ............... 327/172 |
| 5,568,077 A | 10/1996 | Sato et al. |
| 5,572,557 A | 11/1996 | Aoki |
| 5,572,722 A | 11/1996 | Vogley |
| 5,574,698 A | 11/1996 | Raad |
| 5,576,645 A | 11/1996 | Farwell |
| 5,577,079 A | 11/1996 | Zenno et al. |
| 5,577,236 A * | 11/1996 | Johnson et al. .............. 713/400 |
| 5,578,940 A | 11/1996 | Dillon et al. |
| 5,578,941 A | 11/1996 | Sher et al. |
| 5,579,326 A | 11/1996 | McClure |
| 5,581,197 A | 12/1996 | Motley et al. |
| 5,589,788 A | 12/1996 | Goto |

| | | |
|---|---|---|
| 5,590,073 A | 12/1996 | Arakawa et al. |
| 5,594,690 A | 1/1997 | Rothenberger et al. |
| 5,614,855 A | 3/1997 | Lee et al. |
| 5,619,473 A | 4/1997 | Hotta |
| 5,621,340 A | 4/1997 | Lee et al. |
| 5,621,690 A | 4/1997 | Jungroth et al. |
| 5,621,739 A | 4/1997 | Sine et al. |
| 5,627,780 A | 5/1997 | Malhi |
| 5,627,791 A | 5/1997 | Wright et al. |
| 5,631,872 A | 5/1997 | Naritake et al. |
| 5,636,163 A | 6/1997 | Furutani et al. |
| 5,636,173 A | 6/1997 | Schaefer |
| 5,636,174 A | 6/1997 | Rao |
| 5,638,335 A | 6/1997 | Akiyama et al. |
| 5,646,904 A | 7/1997 | Ohno et al. ................. 365/233 |
| 5,652,530 A | 7/1997 | Ashuri |
| 5,657,289 A | 8/1997 | Hush et al. ............ 365/230.05 |
| 5,657,481 A | 8/1997 | Farmwald et al. |
| 5,663,921 A | 9/1997 | Pascucci et al. ............. 365/233 |
| 5,666,313 A | 9/1997 | Ichiguchi ..................... 365/195 |
| 5,666,322 A | 9/1997 | Conkle ........................ 365/233 |
| 5,668,763 A | 9/1997 | Fujioka et al. |
| 5,668,774 A | 9/1997 | Furatani ..................... 365/233 |
| 5,673,005 A * | 9/1997 | Pricer ......................... 331/1 R |
| 5,675,274 A | 10/1997 | Kobayashi et al. |
| 5,675,588 A | 10/1997 | Maruyama et al. |
| 5,692,165 A * | 11/1997 | Jeddeloh et al. ............ 713/400 |
| 5,694,065 A | 12/1997 | Hamasaki et al. |
| 5,708,611 A | 1/1998 | Iwamoto et al. |
| 5,712,580 A | 1/1998 | Baumgartner et al. |
| 5,719,508 A | 2/1998 | Daly |
| 5,737,342 A | 4/1998 | Ziperovich |
| 5,740,123 A | 4/1998 | Uchida ........................ 365/233 |
| 5,751,665 A | 5/1998 | Tanoi |
| 5,767,715 A | 6/1998 | Marquis et al. |
| 5,768,177 A | 6/1998 | Sakuragi ..................... 365/194 |
| 5,774,699 A | 6/1998 | Nagae |
| 5,778,214 A | 7/1998 | Taya et al. |
| 5,781,499 A | 7/1998 | Koshikawa ................. 365/233 |
| 5,784,422 A | 7/1998 | Heermann |
| 5,789,947 A | 8/1998 | Sato |
| 5,790,612 A | 8/1998 | Chengson et al. |
| 5,794,020 A | 8/1998 | Tanaka et al. |
| 5,805,931 A | 9/1998 | Morzano et al. |
| 5,812,619 A | 9/1998 | Runaldue |
| 5,822,314 A | 10/1998 | Chater-Lea |
| 5,831,929 A | 11/1998 | Manning ..................... 365/233 |
| 5,841,707 A | 11/1998 | Cline et al. ................. 365/194 |
| 5,852,378 A | 12/1998 | Keeth |
| 5,872,959 A | 2/1999 | Nguyen et al. |
| 5,889,829 A | 3/1999 | Chiao et al. |
| 5,898,242 A | 4/1999 | Peterson |
| 5,898,674 A | 4/1999 | Mawhinney et al. |
| 5,917,760 A | 6/1999 | Millar ........................ 365/194 |
| 5,920,518 A | 7/1999 | Harrison et al. ............. 365/233 |
| 5,926,047 A | 7/1999 | Harrison |
| 5,926,436 A | 7/1999 | Toda et al. .................. 365/236 |
| 5,940,608 A | 8/1999 | Manning |
| 5,940,609 A | 8/1999 | Harrison |
| 5,946,244 A | 8/1999 | Manning ..................... 365/194 |
| 5,953,284 A | 9/1999 | Baker et al. ................. 365/233 |
| 5,953,386 A | 9/1999 | Anderson |
| 5,964,884 A | 10/1999 | Partovi et al. ............... 713/503 |
| 5,990,719 A | 11/1999 | Dai et al. |
| 6,005,823 A | 12/1999 | Martin et al. ........... 365/230.08 |
| 6,011,732 A | 1/2000 | Harrison et al. ............. 365/194 |
| 6,016,282 A | 1/2000 | Keeth ......................... 365/233 |
| 6,023,489 A | 2/2000 | Hatch |
| 6,026,050 A | 2/2000 | Baker et al. |
| 6,029,250 A | 2/2000 | Keeth ......................... 713/400 |
| 6,038,219 A | 3/2000 | Mawhinney et al. |
| 6,067,592 A | 5/2000 | Farmwald et al. .......... 710/104 |
| 6,101,152 A | 8/2000 | Farmwald et al. .......... 365/233 |
| 6,101,197 A | 8/2000 | Keeth et al. |
| 6,105,157 A | 8/2000 | Miller ........................ 714/744 |
| 6,147,905 A | 11/2000 | Seino ..................... 365/185.11 |
| 6,147,916 A | 11/2000 | Ogura ........................ 365/203 |
| 6,160,423 A | 12/2000 | Haq |
| 6,262,921 B1 | 7/2001 | Manning ..................... 365/194 |
| 6,269,451 B1 | 7/2001 | Mullarkey ................... 713/401 |
| 6,298,450 B1 | 10/2001 | Liu et al. ..................... 713/502 |
| 6,327,196 B1 | 12/2001 | Mullarkey ................... 365/194 |
| 6,338,127 B1 | 1/2002 | Manning ..................... 711/167 |
| 6,378,079 B1 | 4/2002 | Mullarkey ................... 713/401 |
| 6,499,111 B2 | 12/2002 | Mullarkey ................... 713/401 |

OTHER PUBLICATIONS

Anonymous, "Programmable Pulse Generator", IBM Technical Disclosure Bulletin, vol. 17, No. 12, May 1975, pp. 3553–3554.

Anonymous, "Pulse Combining Network", IBM Technical Disclosure Bulletin, vol. 32, No. 12, May 1990, pp. 149–151.

Anonymous, "Variable Delay Digital Circuit", IBM Technical Disclosure Bulletin, vol. 35, No. 4A, Sep. 1992, pp. 365–366.

Arai, Y. et al., "A CMOS Four Channel ×1K Time Memory LSI with 1–ns/b Resolution", IEEE Journal of Solid–State Circuits, vol. 27, No. 3,M, 8107 Mar., 1992, No. 3, New York, US.

Arai, Y. et al., "A Time Digitizer CMOS Gate–Array with a 250 ps Time Resolution", XP 000597207, IEEE Journal of Solid–State Circuits, vol. 31, No. 2, Feb. 1996.

Aviram, A. et al., "Obtaining High Speed Printing on Thermal Sensitive Special Paper With A Resistive Ribbon Print Head", IBM Technical Disclosure Bulletin, vol. 27, No. 5, Oct. 1984, pp. 3059–3060.

Bazes, M., "Two Novel Fully Complementary Self–Biased CMOS Differential Amplifiers", IEEE Journal of Solid–State Circuits, vol. 26, No. 2, Feb. 1991, pp. 165–168.

Chapman, J. et al., "A Low–Cost High–Performance CMOS Timing Vernier for ATE", IEEE International Test Conference, Ppaer 21.2, 1995, pp. 459–468.

Cho, J. "Digitally–Controlled PLL with Pulse Width Detection Mechanism for Error Correction", ISSCC 1997, Paper No. SA 20.3, pp. 334–335.

Christiansen, J., "An Integrated High Resolution CMOS Timing Generator Based on an Array of Delay Locked Loops", IEEE Journal of Solid–State Circuits, vol. 31, No. 7, Jul. 1996, pp. 952–957.

Combes, M. et al., "A Portable Clock Multiplier Generator Using Digital CMOS Standard Cells", IEEE Journal of Solid–State Circuits, vol. 31, No. 7, Jul. 1996, pp. 958–965.

Donnelly, K. et al., "A 660 MB/s Interface Megacell Portable Circuit in 0.3 $\mu$m–0.7 $\mu$m CMOS ASIC", IEEE Journal of Solid–State Circuits, vol. 31, No. 12, Dec. 1996, pp. 1995–2001.

Goto, J. et al., "A PLL–Based Programmable Clock Generator with 50– to 350–MHz Oscillating Range for Video Signal Processors", IEICE Trans. Electron., vol. E77–C, No. 12, Dec. 1994, pp. 1951–1956.

Hamamoto, T., 400–MHz Random Column Operating SDRAM Techniques with Self–Skew Compensation, IEEE Journal of Solid–State Circuits, vol. 33, No. 5, May 1998, pp. 770–778.

Ishibashi, A. et al., "High–Speed Clock Distribution Architecture Employing PLL for 0.6µm CMOS SOG", IEEE Custom Integrated Circuits Conference, 1992, pp. 27.6.1–27.6.4.

Kim, B. et al., "A 30MHz High–Speed Analog/Digital PLL in 2µm CMOS", ISSCC, Feb. 1990.

Kikuchi, S. et al., "A Gate–Array Based 666MHz VLSI Test System", IEEE International Test Conference, Paper 21.1, 1995, pp. 451–458.

Ko, U. et al., "A 30–ps Jitter, 3.6–µs Locking, 3.3–Volt Digital PLL for CMOS Gate Arrays", IEEE Custom Integrated Circuits Conference. 1993, pp. 23.3.1–23.3.4.

Lee, T. et al., "A 2.5V Delay–Locked Loop for an 18Mb 500MB/s DRAM", IEEE International Solid–State Circuits Conference Digest of Technical Papers, Paper No. FA 18.6, 1994, pp. 300–301.

Lesmeister, G., "A Densely Integrated High Performance CMOS Tester", International Test Conference, Paper 16.2, 1991, pp. 426–429.

Ljuslin, C. et al., "An Integrated 16–channel CMOS Time to Digital Converter", IEEE Nuclear Science Symposium & Medical Imaging Conference Record, vol. 1, 1993, pp. 625–629.

Nakamura, M. et al., "A 156 Mbps CMOS Clock Recovery Circuit for Burst–mode Transmission", Symposium on VLSI Circuits Digest of Technical Papers, 1996, pp. 122–123.

Nielson, E., "Inverting latches make simple VCO", EDN, Jun. 19, 1997.

Novof, I. et al., "Fully Integrated CMOS Phase–Locked Loop with 15 to 240 MHz Locking Range and ±50 ps Jitter", IEEE Journal of Solid–State Circuits, vol. 30, No. 11, Nov. 1995, pp. 1259–1266.

Santos, D. et al., "A CMOS Delay Locked Loop And Sub–Nanosecond Time–to–Digital Converter Chip", IEEE Nuclear Science Symposium and Medical Imaging Conference Record, vol. 1, Oct. 1995, pp. 289–291.

Saeki, T. et al., "A 2.5–ns Clock Access, 250–MHz, 256–Mb SDRAM with Synchronous Mirror Delay", IEEE Journal of Solid–State Circuits, vol. 31, No. 11, Nov. 1996, pp. 1656–1665.

Shirotori, T. et al., "PLL–based, Impedance Controlled Output Buffer", 1991 Symposium on VLSI Circuits Digest of Technical Papers, pp. 49–50.

Sidiropoulos, S. et al., "A 700–Mb/s/pin CMOS Signaling Interface Using Current Integrating Receivers", IEEE Journal of Solid–State Circuits, vol. 32, No. 5, May 1997, pp. 681–690.

Sidiropoulos, S. et al., "A CMOS 500 Mbps/pin synchronous point to point link interface", IEEE Symposium on VLSI Circuits Digest of Technical Papers, 1994, pp. 43–44.

Sidiropoulos, S. et al., "A Semi–Digital DLL with Unlimited Phase Shift Capability and 0.08–400MHz Operating Range," in *1997 International Solid State Circuits Conference,* Feb. 8, 1997, pp. 332–333.

Soyuer, M. et al., "A Fully Monolithic 1.25GHz CMOS Frequency Synthesizer", IEEE Symposium on VLSI Circuits Digest of Technical Papers, 1994, pp. 127–128.

Taguchi, M. et al., "A 40–ns 64–Mb DRAM with 64–b Parallel Data Bus Architecture", IEEE Journal of Solid–State Circuits, vol. 26, Nov. 1991, pp. 1493–1497.

Tanoi, S. et al., "A 250–622 MHz Deskew and Jitter–Suppressed Clock Buffer Using a Frequency– and Delay–Locked Two–Loop Architecture", 1995 Symposium on VLSI Circuits Digest of Technical Papers, vol. 11, No. 2, pp. 85–86.

Tanoi, S. et. al., "A 250–622 MHz Deskew and Jitter–Suppressed Clock Buffer Using Two–Loop Architecture", IEEE IEICE Trans. Electron., vol. E–79–C. No. 7, Jul. 1996, pp. 898–904.

von Kaenel, V. et al., "A 320 Mhz, 1.5 mW @ 1.35 V CMOS PLL for Microprocessor Clock Generation", IEEE Journal of Solid–State Circuits, vol. 31, No. 11, Nov. 1996, pp .1715–1722.

Watson, R. et al., "Clock Buffer Chip with Absolute Delay Regulation Over Process and Environmental Variations", IEEE Custom Integrated Circuits Conference, 1992, pp. 25.2.1–25.2.5.

Yoshimura, T. et al. "A 622–Mb/s Bit/Frame Synchronizer for High–Speed Backplane Data Communication", IEEE Journal of Solid–State Circuits, vol. 31, No. 7, Jul. 1996, pp. 1063–1066.

Gustavsion, David B., et al., "IEEE Standard for Scalable Coherent Interface (SCI)," IEEE Computer Society, IEEE Std. 1596–1992, Aug. 2, 1993.

Maneatis, John G., "Low–Jitter Process Independent DLL and PLL Based on Self–Biased Techniques," IEEE Journal of Solid–State Circuits, vol. 31, No. 11: pp. 1723–1732, Nov. 1996.

Descriptive literature entitled, "400 MHz SLDRAM, 4M×16 SLDRAM Pipelined, Eight Bank, 2.5 V Operation," pp. 1–22.

"Draft Standard for a High–Speed Memory Interface (SyncLink)," Microprocessor and Microcomputer Standards Subcommittee of the IEEE Computer Society, Copyright 1996 by the Institute of Electrical Engineers, Inc., New York, NY, pp. 1–56.

Park, D. et al., "Fast Acquisition Frequency Synthesizer with the Multiple Phase Detectors", IEEE Pacific Rim Conference on Communications, Computers and Signal Processing, vol. 2, May 1991, pp. 665–668.

* cited by examiner

MEMORY SYSTEM WITH DYNAMIC TIMING CORRECTION

TECHNICAL FIELD

The present invention relates to memory systems and memory devices, and more particularly, to dynamic timing correction in memory systems and memory devices.

BACKGROUND OF THE INVENTION

Timing of operations in synchronous memory systems must tightly controlled if the memory system is to operate at optimum rates. Typically, timing of operations in synchronous systems is controlled by a memory controller operating in synchronization with edges of the master clock signal.

One problem that often occurs in such system arises from differences in propagation times of signals between a memory controller and memory devices controlled by the memory controller. Such timing differences may prevent the memory system from operating at its optimum rate. For example, the memory controller typically accepts new data from a memory device at leading clock edges (i.e., transitions of the master clock signal from low to high). If one of the memory devices outputs data at the specified clock edge propagation delays from the memory device to the memory controller may cause the data to arrive later than the specified clock edge. Therefore, the memory device outputs data a short time before the leading edge to compensate for propagation of delays.

One problem with such an approach is that propagation delays between the memory device and memory controller will depend upon the effective distance between the memory controller and the memory device, which depends upon the routing of signal lines connecting the memory controller to the memory device. Consequently, the data may still not arrive at the memory controller at the specified leading edge. Therefore, the memory controller must be prepared to accept the data for some time before and after the clock edge. To allow sufficient time to look for the data, the memory controller allots a larger than optimum time period for accepting the data. The overall speed of the memory system is limited correspondingly.

SUMMARY OF THE INVENTION

A memory system includes a memory controller coupled to a plurality of memory devices. The memory controller includes a master clock generator that provides a master clock signal for controlling timing of operations within the memory system. The memory controller also includes a data clock generator that provides a data clock signal to control timing of data transfer to and from the memory devices.

Each of the memory devices includes an echo clock generator that generates an echo clock signal in response to the master clock signal. The echo clock generator includes an output vernier that receives the master clock signal and produces a delayed data clock signal. The delayed data clock signal drives an output register to provide output data to a data bus. Each memory device also transmits the delayed data clock signal to the memory controller as the echo clock signal.

Within the memory controller a phase comparator compares the echo clock signal to the master clock signal to identify any phase shift of the echo clock signal relative to the master clock signal. In response to the determined phase shift, control logic of the memory controller provides control data to the memory devices to adjust the vernier, thereby reducing the phase shift.

In one embodiment, the phase comparator is formed from a plurality of phase detectors, where each phase detector has a first input driven by the echo clock signal. The phase detectors also have second inputs that receive phase-shifted versions of the maser clock signal.

To produce the phase-shifted versions of the master clock signal the memory controller includes a delay-locked loop driven by the master clock signal. The delay-locked loop includes a multiple output variable delay circuit that outputs the phase-shifted versions of the master clock signal. In one embodiment, the phase-shifted versions of the master clock signal include versions shifted relative to the master clock signal by 0, +τ, −τ, +2τ, and −2τ, where τ is a selected increment greater than half of the finest adjustment available in the vernier.

The use of a plurality of phase detectors driven by taps of a delay-locked loop allows the echo clock signal to be phase compared to the master clock signal in real time. Thus, the memory controller can dynamically adjust timing of the memory devices to accommodate drift in routing delays of the memory system.

DETAILED DESCRIPTION OF THE INVENTION

Figure 1:
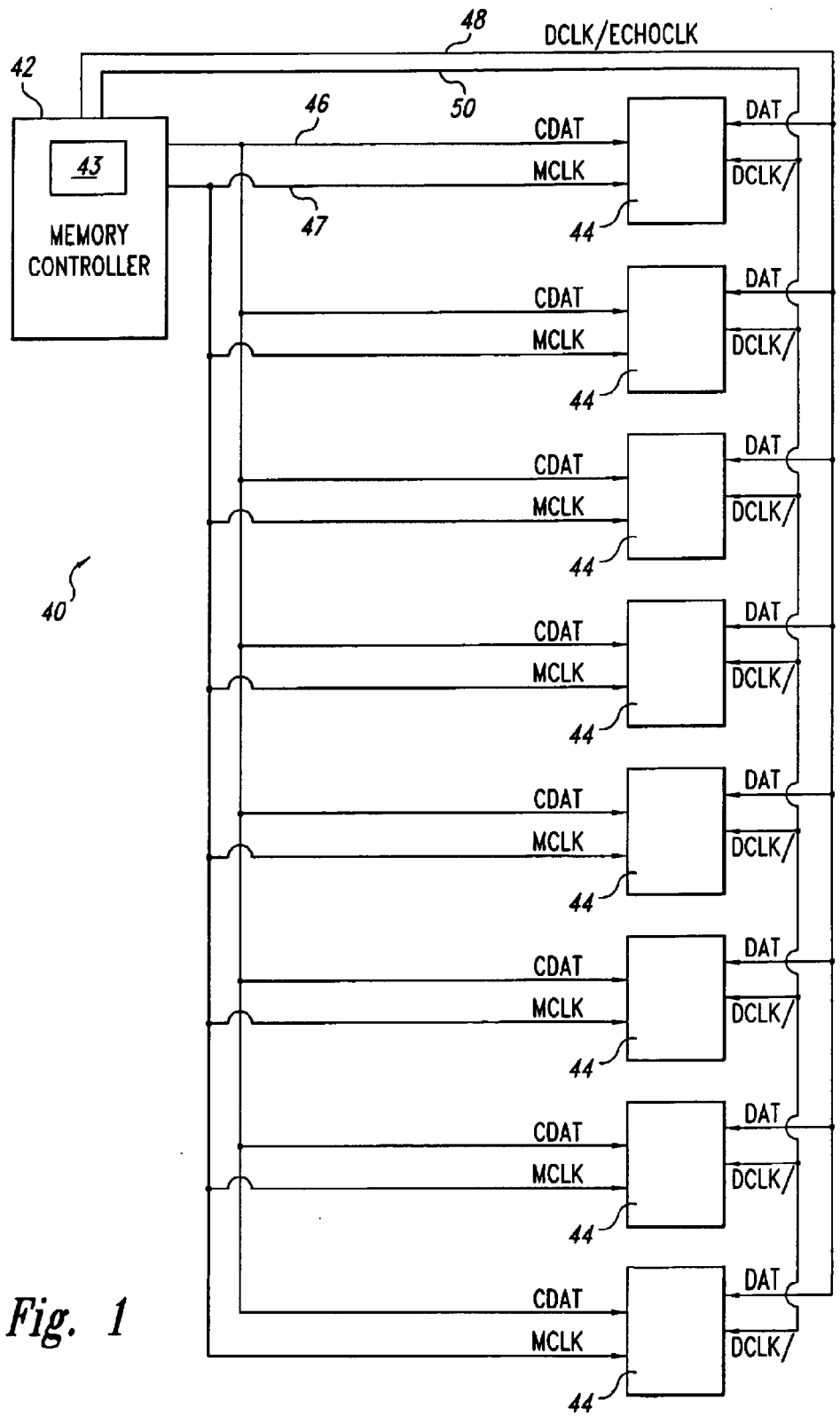
FIG. 1 is a block diagram of a memory system including a memory controller and eight memory devices.

As shown in FIG. 1, a memory system 40 includes a memory controller 42 that controls eight memory devices 44 as directed by a logic control circuit 43. The memory devices 44 and memory controller 42 operate according to a packet protocol. According to the packet protocol, the controller 42 generates a control data packet containing control data CDAT for reading to or writing from one of the memory devices 44 or for initiating a memory event, such as reset or autorefresh. Among the control data CDAT, the data packet includes fields identifying the memory device 44 to which the packet is directed, fields containing command data, and fields containing addressing information, such as row, column, bank, or register addresses. The memory controller 42 transmits the control data packet to all of the memory devices 44 on a control data bus 46 that is coupled to control data inputs of all of the memory devices 44.

In addition to the control data packets, the memory controller 42 also provides a master clock signal MCLK on a master clock bus 47 to control timing of operations throughout the memory system 40. Additionally, the memory controller 42 transfers data to and from the memory devices on a data bus 48. To control timing of data transfers to the memory device 44, the memory controller 42 provides a data clock signal DCLK on a data clock bus 50. The data clock signal DCLK forms a clocking signal that indicates arrival of the data DAT at each of the memory devices 44.

The master clock signal MCLK is a continuously running clock that provides overall system timing while the data clock DCLK is discontinuous, i.e., the data clock signal DCLK contains clock pulses only during intervals in which write data DAT is present.

Upon initialization of the memory system 40, the memory controller 42 establishes the timing of each of the memory devices 44 such that data DAT from the memory devices 44 arrive at the memory controller 42 coincident with edges the master clock signal MCLK as will now be described.

Figure 2:
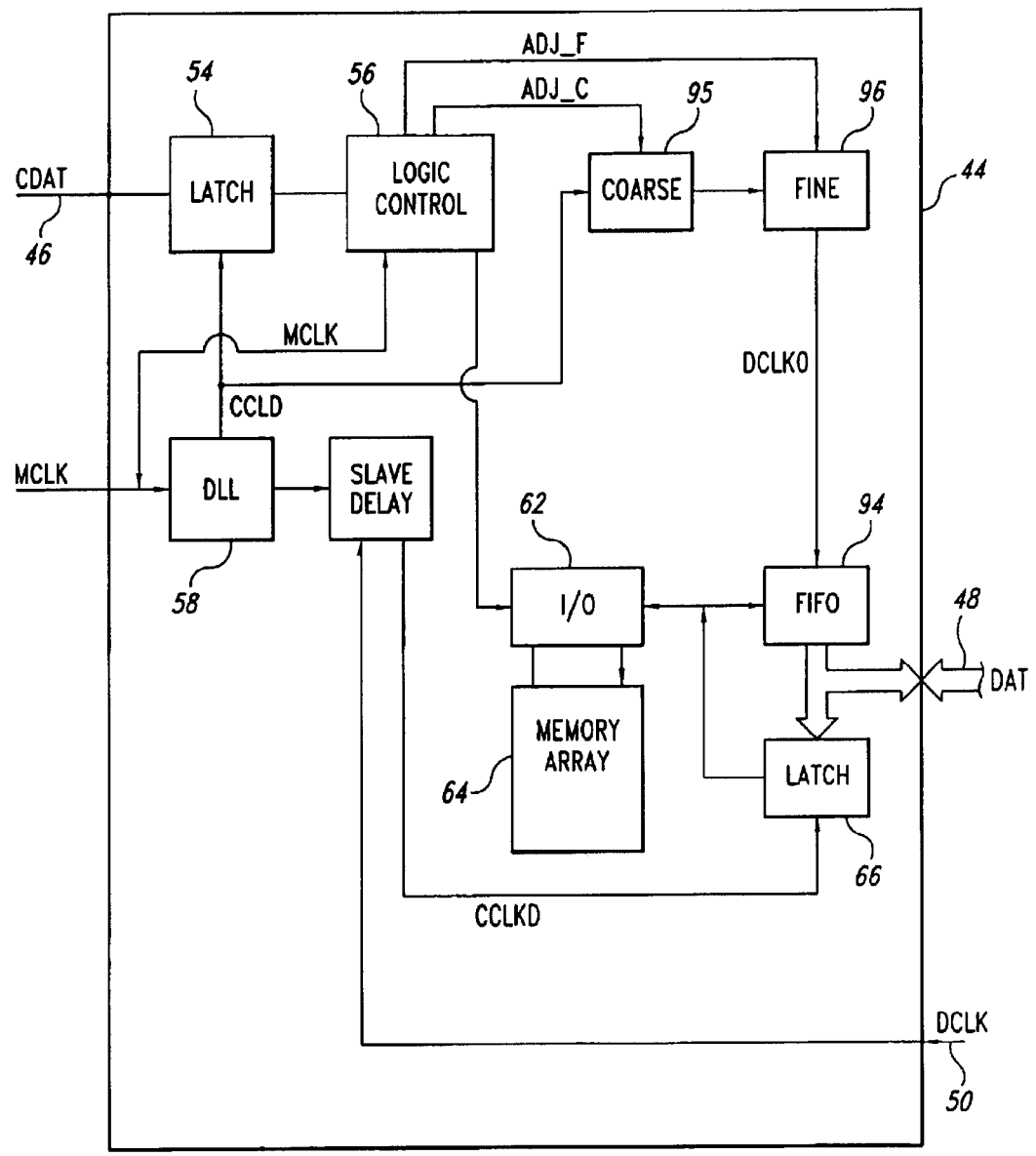
FIG. 2 is a block diagram of one of the memory devices of FIG. 1.

To establish the timing, the memory controller 42 first sends control data packets to each memory device 44 instructing the memory devices 44 to provide selected data on the data bus 48 at specified edges of the master clock signal MCLK. With further reference to FIG. 2, when the control data CDAT arrives at the memory device 44, the packet is captured in control data latches 54 in response to a delayed master clock signal CCLKD which is a phase-delayed version of the master clock signal MCLK. The delayed master clock signal CCLKD is produced by a delay-locked loop 58 as described in concurrently filed U.S. Pat. No. 5,920,518, entitled SYNCHRONOUS CLOCK GENERATOR INCLUDING DELAY-LOCKED LOOP which is commonly assigned herewith and which is incorporated herein by reference. The latched control data CDAT is then decoded by a logic control circuit 56 that controls operations within the memory device 44. The logic control circuit 56 identifies control data CDAT in the packet specifying a read operation and activates an I/O interface 62 to read data DAT from a memory array 64. The data DAT read from the memory array 64 are transferred to an output data latch 66 and then to a read FIFO register 94. The data DAT are held in the FIFO register 94 until the FIFO register 94 is activated by a delayed output clock signal DCLKO from coarse and fine verniers 95, 96. Initially (i.e., prior to receipt of the packets of control data), the logic control circuit 56 sets the coarse and fine verniers 95, 96 with a default delay relative to the delayed master clock signal CCLKD to produce a delayed output clock signal DCLKO. The delayed output clock signal DCLKO activates the read FIFO register 94 to place the output data DAT on the data bus 48.

The memory controller 42 receives the data from the data bus 48 and compares the arrival times of the data to the specified edges of the master clock signal MCLK. Based upon the comparisons, the memory controller 42 determines respective routing delays for each of the memory devices 44 and issues a second control data packet to each of the memory devices 44 establishing an internal timing adjustment to compensate for the respective routing delay. The memory device 44 receives the second control data packet and the logic control circuit 56 identifies control data CDAT within the packet specifying a coarse delay adjust and a fine delay adjust and outputs coarse and fine adjust signals ADJ_C, ADJ_F, thereby adjusting the coarse and fine verniers 95, 96 to compensate for the routing delays.

While the above approach allows control of the initial delay in each of the memory devices 44 upon initialization of the memory system 40, the initial settings of the coarse and fine verniers 95, 96 may become incorrect if the routing delays of the data clock bus 50 or the master clock bus 47 drift over time, as for example, may be caused by aging, temperature or frequency variations. Consequently, the timing of the memory system 40 may no longer be such that the data DAT arrive at the memory controller 42 coincident with edges of the master clock signal MCLK. Under such circumstances, some data may be lost, or the memory system 40 may not operate at its optimum rate.

Figure 3:
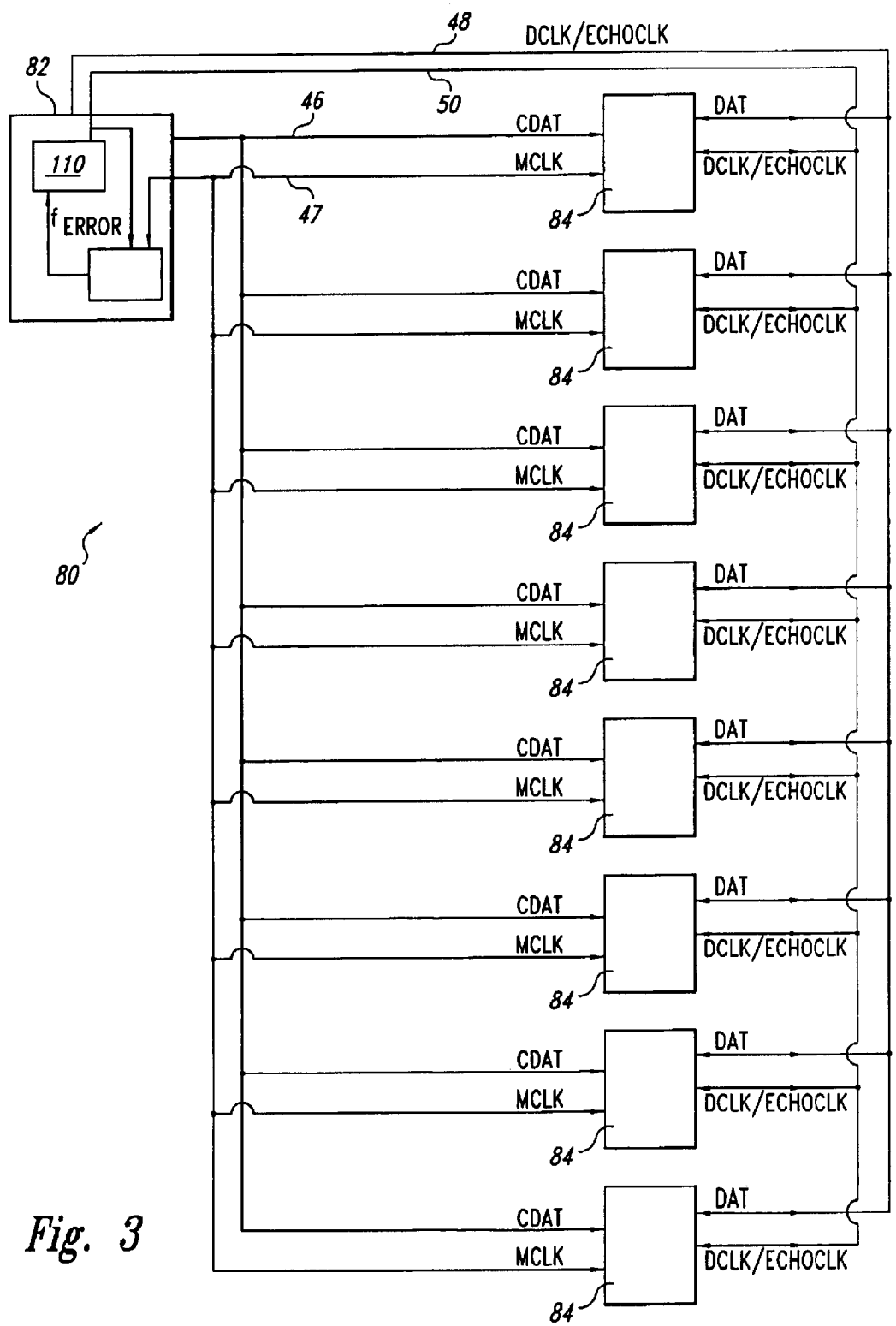
FIG. 3 is a block diagram of another embodiment of the memory system including a memory controller and eight memory devices where each memory device includes an echo clock generator coupled to the memory controller and the memory controller includes a phase comparing circuitry.

FIG. 3 shows a memory system 80 according to another embodiment of the invention that corrects drifts of the signal timing. The memory system 80 operates under control of a memory controller 82 that controls eight memory devices 84 through commands issued over the control data bus 46 and through the master clock signal MCLK carried by the master clock bus 47. Additionally, the memory controller 82 transmits data to and receives data from the memory devices 84 over the data bus 48 and provides the data clock signal DCLK synchronously with the data DAT to enable latching of the data DAT at the memory devices 84.

Figure 4:
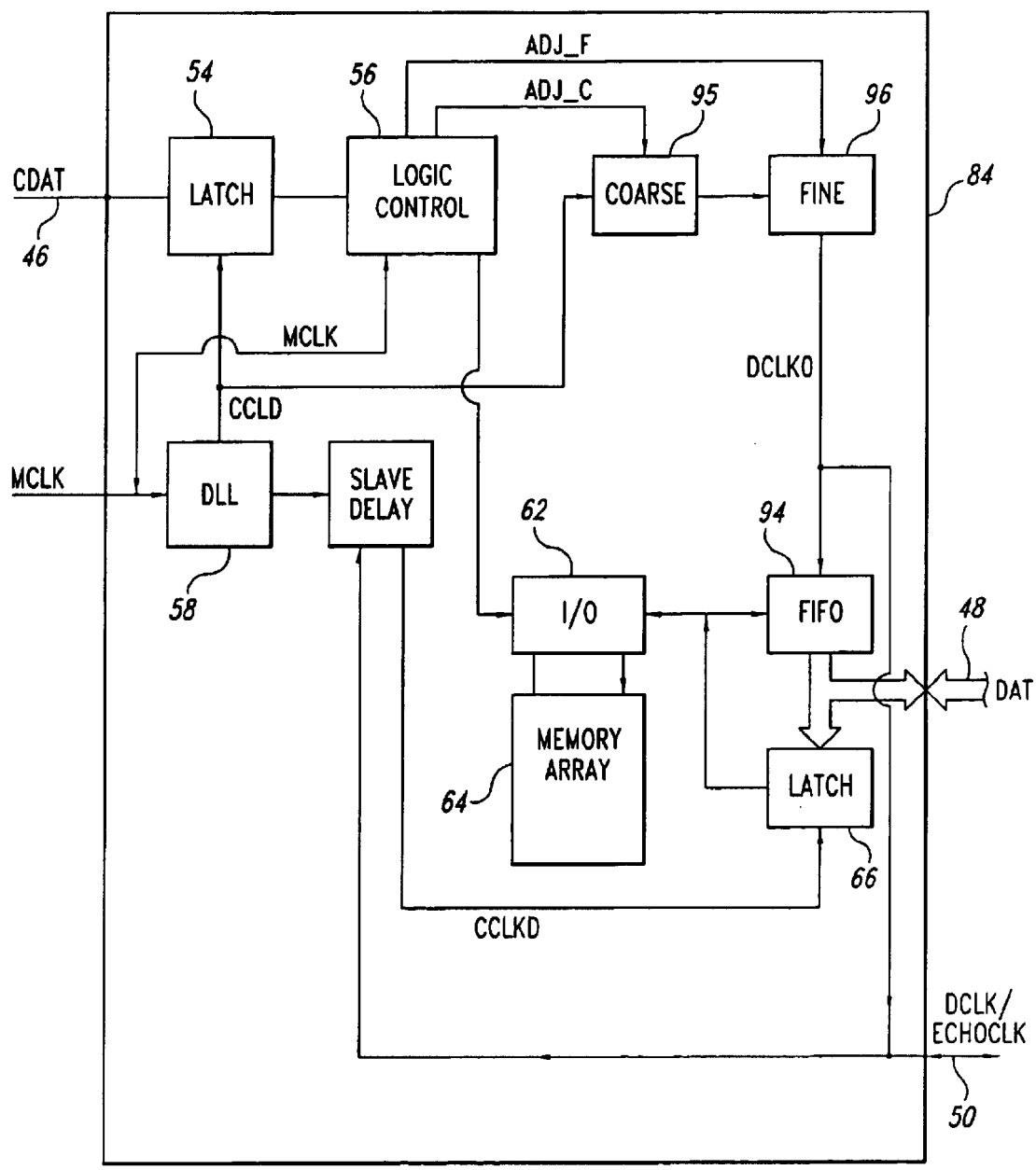
FIG. 4 is a block diagram of one of the memory devices of the memory system of FIG. 3.

FIG. 4 shows the structure of one of the memory devices 84 in greater detail in which the memory device 84 receives control data CDAT at the control data latches 54. The latches 54 latch the control data CDAT in response to the delayed master clock CCLKD produced by the delay-locked loop 58.

When the memory controller 82 instructs the memory device 44 to output data, the logic control circuit 56 activates the I/O interface 62 to transfer data from the memory array 64 to the output FIFO 94. The data DAT are held in the FIFO register 94 until the delayed output clock signal DCLKO activates the FIFO register 94.

As with the memory device 84 discussed previously, the coarse and fine venires 96 provide the delayed output data clock signal DCLKO in response to the delayed master clock signal CCLKD. The fine vernier 96 is a variable delay line having its delay time controlled by the logic control circuit 56. The fine vernier 96 is selectively adjustable to adjust the delay between the delayed master clock signal CCLKD and the delayed output clock signal DCLKO by increments of approximately 150 ps. The fine vernier 96 therefore activates the FIFO register 94 to transmit the read data before or after the specified leading edge of the master clock MCLK. As discussed previously, the fine vernier 96 thus allows each memory device 84 to be "tuned" to compensate for routing delay differences between various memory devices 84 and the memory controller 82.

Unlike the previously described embodiment, the memory device 84 of FIG. 4 also provides the delayed output data clock signal DCLKO to the data clock bus 50 as an echo clock signal ECHOCLK. The echo clock signal ECHOCLK travels to the memory controller 82 on the data clock bus 50 coincident with the output data DAT traveling on the data bus 48. The propagation times of signals on the data clock bus 50 and the data bus 48 are substantially the same. Therefore, drifts in the timing of echo clock signal ECHOCLK timing will mirror drifts in timing of the data DAT. The memory controller 82 can thus continuously monitor and correct variations in routing delays, as will be described now with reference to FIG. 5.

Figure 5:
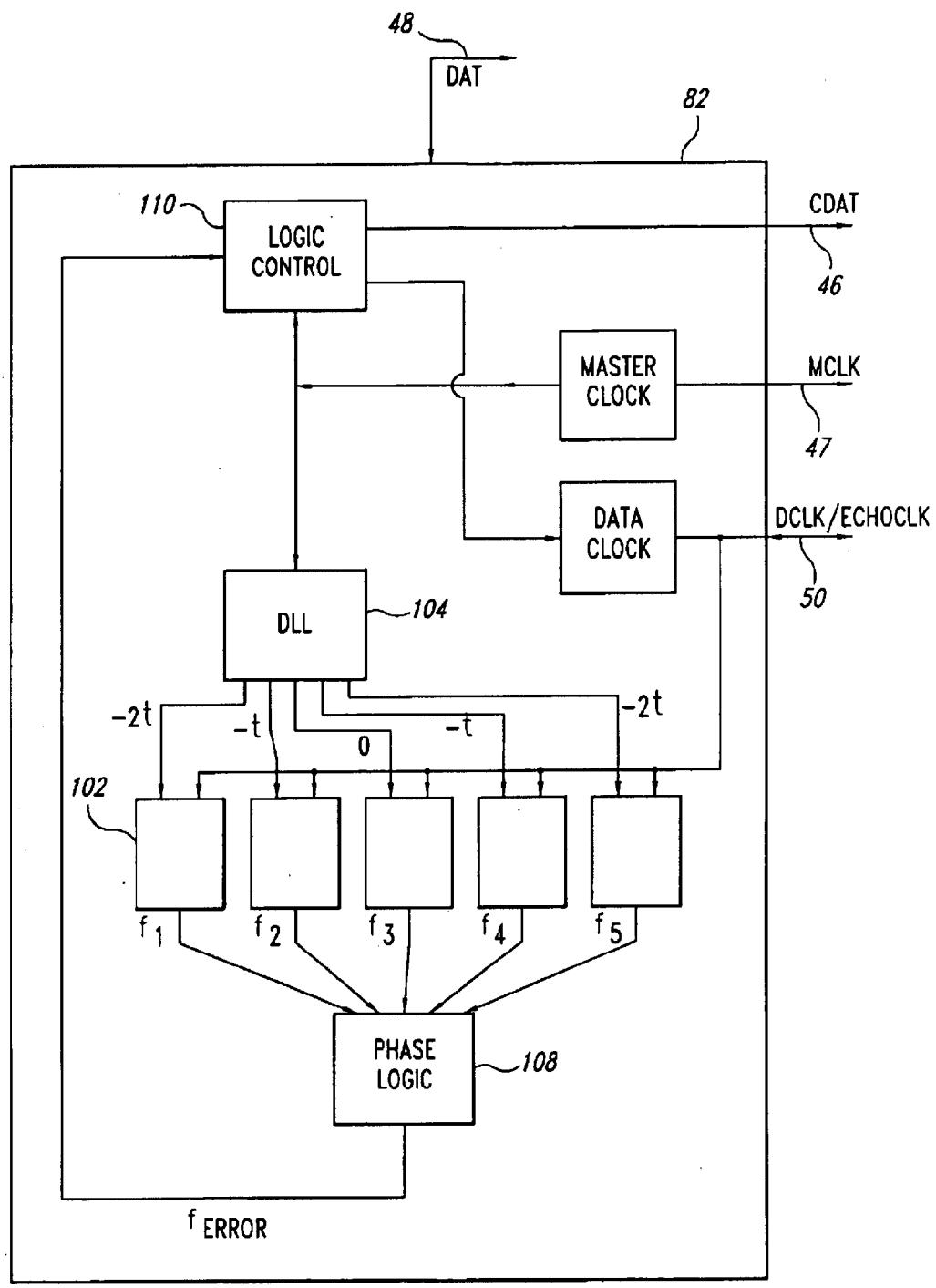
FIG. 5 is a block diagram of the master controller of FIG. 3.

As shown in FIG. 5, the memory controller 82 receives the echo clock signal ECHOCLK from the data clock bus 50. Within the memory controller 82, the echo clock signal ECHOCLK is applied to respective first inputs of five phase comparators 102. The second inputs of the phase comparators 102 are driven by respective outputs of a multiple output delay-locked loop 104 driven by the master clock signal MCLK. The delay-locked loop 104 provides phase-shifted output signals at the frequency of the master clock signal MCLK with respective positive or negative phase shifts relative to the master clock signal MCLK. Each of the phase comparators 102 compares the echo clock signal ECHOCLK to the respective output of the delay-locked loop and outputs a respective phase compare signal $\phi_1$–$\phi_5$. A phase logic circuit 108 receives the phase signals $\phi_1$–$\phi_5$ and identifies the approximate phase shift of the echo clock signal ECHOCLK relative to the master clock signal MCLK by comparing the phase signals $\phi_1$–$\phi_5$. The phase logic circuit 108 then provides phase error signals $\phi_{ERROR}$ to a logic control circuit 110 indicating the phase shift and other conditions, including the direction of the phase shift.

The logic control circuit 110 uses the phase error signals $\phi_{ERROR}$ to determine whether or not the echo clock signal ECHOCLK is within one vernier increment of the master clock signal MCLK. If the echo clock signal ECHOCLK is not within one vernier increment of the master clock signal MCLK, the logic control circuit 110 sends control data (in the next set of control data addressed to the memory device 84) to command the memory device 84 to adjust the vernier by one or more increments. In response to the control data from the memory controller 82, the logic control circuit 56 (FIG. 4) establishes a new fine adjust signal ADJ_F to adjust the setting of the fine vernier 96 (FIG. 4). The delay of the fine vernier 96 changes the delay of the delayed output clock signal DCLKO correspondingly. Because the delayed output clock signal DCLKO controls timing of data DAT on the data bus 48, the revised output data signal DCLKO changes the timing of data DAT as instructed by the memory controller 82. The memory controller 82 thus continuously monitors and corrects the timing of the memory devices 84 such that the data DAT arrive at the memory controller 82 coincident with edges of the master clock signal MCLK.

Figure 6:
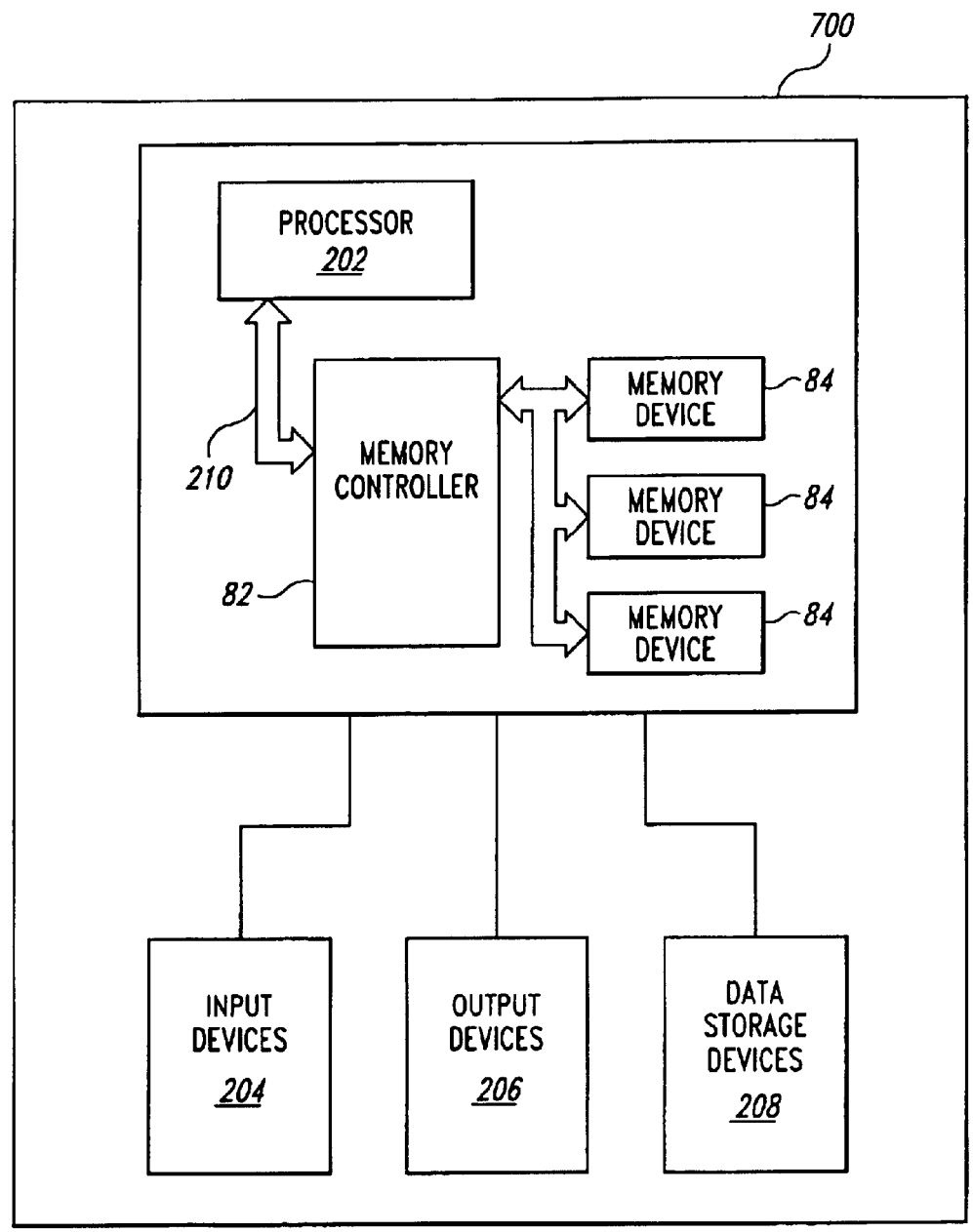
FIG. 6 is a block diagram of a computer system including the memory system of FIG. 3.

FIG. 6 is a block diagram of a computer system 200 that contains the memory controller 82 of FIG. 5 and three of the memory devices 84 of FIG. 4. The computer system 200 includes a processor 202 for performing computer functions such as executing software to perform desired calculations and tasks. The processor 202 also includes command, address and data buses 210 to activate the memory controller 82, thereby controlling reading from and writing to the memory devices 84. One or more input devices 204, such as a keypad or a mouse, are coupled to the processor 202 and allow an operator to manually input data thereto. One or more output devices 206 are coupled to the processor 202 to display or otherwise output data generated by the processor 202. Examples of output devices include a printer and a video display unit. One or more data storage devices 208 are coupled to the processor to store data on or retrieve data from external storage media (not shown). Examples of storage devices 208 and storage media include drives that accept hard and floppy disks, tape cassettes and compact-disk read-only memories.

From the foregoing it will be appreciated that, although specific embodiments of the invention have been described herein for purposes of illustration, various modifications may be made without deviating from the spirit and scope of the invention. For example, the echo clock signal ECHOCLK may be carried by a separate signal line, rather than being carried by the data clock bus 50. Similarly, the memory controller 82 can employ other phase comparing circuits in place of the delay-locked loop 104 and bank of phase comparators 102. Also, although the embodiment described herein adjusts both the coarse and fine verniers 95, 96, where the drift of timing in not excessive, the memory controller 42 may transmit data adjusting only the fine vernier 96. In such an embodiment, the logic control circuit 56 keeps track of the total phase shift of the fine vernier 96 so that, if the fine vernier 96 reaches its adjustment limit or would move the phase shift past 360°, the logic control circuit 56 increments the coarse vernier 95 by one clock period and returns the fine vernier 95 to a lower setting referenced to the new course vernier setting. Accordingly, the invention is not limited except as by the appended claims.

What is claimed is:

1. A method of adjusting data timing in a memory system having a memory device and a memory controller, the system operating according to a master clock signal, the method comprising the steps of:

establishing an initial output timing at the memory device;

transmitting an echo clock signal from the memory device to the memory controller according to the initial output timing;

receiving the echo clock signal at the memory controller;

identifying a phase error of the received echo clock signal relative to the master clock signal;

transmitting control data from the memory controller to the memory device for revising the initial output timing in response to the identified phase error to produce a revised output timing;

revising the initial output timing at the memory device according to the control data; and transmitting the echo clock signal from the memory device to the memory controller according to the revised output timing.

2. The method of claim 1 wherein the step of identifying a phase error of the received echo clock signal relative to the master clock signal comprises:

generating a plurality of phase shifted signals responsive to the master clock signal;

comparing the echo clock signal to each of the phase shifted signals; and identifying one of the phase shifted signals having a phase within a selected range of phases relative to the echo clock signal.

3. The method of claim 1 wherein the establishing of an initial output timing:

setting a delay of a delay circuit; and applying the master clock signal to the delay circuit to produce the echo clock signal.

4. The method of claim 1 wherein the establishing of an initial output timing further comprises:

storing data in an output register;

clocking the register with the echo clock signal; and outputting data from the register in response to the echo clock signal.

5. The method of claim 3 wherein the revising of the initial output timing comprises adjusting the delay of the delay circuit.

6. A method of controlling data flow in a memory system including a memory controller and a memory device, the method comprising:

generating a master clock signal;

transmitting the master clock signal from the memory controller to the memory device;

issuing a first read command to the memory device;

producing a first set of data and an echo signal at the memory device in response to the first read command, the echo signal having a phase shift relative to the master clock signal;

transmitting the first set of data to the memory controller with a time delay relative to the echo signal;

transmitting the echo signal to the memory controller;

receiving the echo signal at the memory controller;

comparing the received echo signal to the master clock signal;

selecting an adjusted time delay in response to the step of comparing the received echo signal to the master clock signal;

issuing a second read command to the memory device;

producing a second set of data at the memory device in response to the second read command; and transmitting to the memory controller the second set of data with the adjusted time delay.

7. The method of claim 6 wherein the selecting of an adjusted time delay adjusting a vernier.

8. The method of claim 6 wherein the comparing of the received echo signal to the master clock signal comprises:

producing a plurality of phase-shifted signals in response to the master clock signal; and comparing the echo signal to each of the phase-shifted signals.

9. The method of claim 8 wherein the selecting of an adjusted time delay comprises identifying one of the phase-shifted signals closest in phase to the echo clock signal.

10. A memory controller for a memory system including a plurality of memory devices coupled to common clock and command busses, the memory devices producing echo signals in response to clock signals on the clock bus, the controller comprising:

a master clock source coupled to the clock bus operative to produce a master clock signal;

a phase comparing circuit coupled to the clock bus and responsive to produce a phase signal in response to a phase difference between the echo signal and the master clock signal;

a logic circuit coupled to the phase comparing circuit and adapted to produce adjustment data in response to the phase signal; and a control data circuit having a command output coupled to the command bus and adapted to produce a command signal at the command output in response to the adjustment data.

11. The memory controller of claim 10 wherein the phase comparator:

a signal source having a plurality of outputs and operative to produce a plurality of phase-shifted signals at the outputs in response to the master clock signal; and a plurality of phase comparator, each phase comparator including a first input coupled to the signal source outputs, a second input coupled to the clock bus to receive echo signals and a phase output coupled to the logic circuit.

12. The memory controller of claim 11 wherein the signal source comprises a multiple output delay-locked loop.

13. A memory system, comprising:

a command bus;

a clock bus;

a data bus;

a memory controller including a master clock generator coupled to the clock bus to generate a master clock signal, a phase comparator having a first input coupled to the master clock generator and a second input and responsive to a phase difference between the first and second inputs to produce an adjust command, and a logic circuit; and a memory device having a clock input coupled to the clock bus, an echo signal generator to generate an echo signal responsive to the master clock signal at the clock input, the echo signal generator being coupled to the second input of the phase comparator, a data latch having a trigger input and responsive to a control signal at the trigger's input to transmit data to the data bus, and a variable delay circuit having a control output coupled to the trigger input and a command input coupled to the command bus, the delay circuit being responsive to the adjust command on the command bus to produce the control signal at a time corresponding to the adjust command.

14. The memory system of claim 13 wherein the phase comparator comprises:

a signal source having a plurality of outputs and operative to produce a plurality of phase-shifted signals at the outputs in response to the master clock signal; and a plurality of phase comparator, each phase comparator including a first input coupled to the signal source outputs, a second input coupled to the echo signal generator and a phase output coupled to the logic circuit.

15. The memory system of claim 14 wherein the signal source comprises a multiple output delay-locked loop.

16. A method of adjusting data timing in a memory system having a memory device and a memory controller, the method comprising:

transmitting a first set of data to the memory device according to a first clock signal;

receiving the first set of data at the memory device;

establishing an initial output timing at the memory device having a default phase relationship with the first clock signal;

transmitting a second set of data from the memory device to the memory controller according to the initial output timing;

receiving the second set of data at the memory controller;

comparing the phase of a second set of data to the phase of the first clock signal in order to identify a phase error;

transmitting a third set of data from the memory controller to the memory device for revising the initial output timing in response to the identified phase error; and revising the initial output timing at the memory device according to the third set of data to produce a revised output timing.

17. The method of adjusting data timing according to claim 16 wherein the transmitting of a second set of data comprises transmitting an echo clock signal.

18. The method of adjusting data timing according to claim 17 wherein the comparing of the second set of data comprises:

generating a plurality of phase shifted signals responsive to the first clock signal;

comparing the echo clock signal to each of the phase shifted signals;

identifying one of the phase shifted signals having a phase within a selected range of phases relative to the echo clock signal; and generating the third set of data according to the identification of the phase shifted signal.

19. The method of adjusting data timing according to claim 16 wherein the revising of the initial output timing at the memory device comprises adjusting a vernier.

20. A method of adjusting data timing in a memory system having a memory device and a memory controller, the method comprising:

establishing an initial output timing at the memory device;

transmitting a first digital signal from the memory device to the memory controller according to the initial output timing;

receiving the first digital signal at the memory controller;

identifying a phase difference of the received digital signal relative to a timing reference signal;

transmitting an adjustment signal from the memory controller to the memory device for revising the initial output timing in response to the identified phase difference to produce a revised output timing;

revising the initial output timing at the memory device according to the adjustment signal; and transmitting a second digital signal from the memory device to the memory controller according to the revised output timing.

21. The method of claim 20 wherein the identifying of a phase difference of the received first digital signal relative to a timing reference signal comprises:

generating a plurality of phase shifted signals responsive to the timing reference signal;

comparing the first digital signal to each of the phase shifted signals; and identifying one of the phase shifted signals having a phase within a selected range of phases relative to the first digital signal.

22. The method of claim 20 wherein the establishing of an initial output timing comprises:

setting a delay of a delay circuit; and applying the timing reference signal to the delay circuit to produce the first digital signal.

23. The method of claim 22 wherein the revising of the initial output timing comprises adjusting the delay of the delay circuit.

24. The method of claim 20 wherein the establishing of an initial output timing further comprises:

storing data in an output register;

clocking the register with the first digital signal; and outputting data from the register in response to the first digital signal.

* * * * *

UNITED STATES PATENT AND TRADEMARK OFFICE
CERTIFICATE OF CORRECTION

PATENT NO. : 6,912,680 B1
APPLICATION NO. : 08/798227
DATED : June 28, 2005
INVENTOR(S) : Brent Keeth It is certified that error appears in the above-identified patent and that said Letters Patent is hereby corrected as shown below:

| Column, Line | Reads | Should Read |
|---|---|---|
| On Title page | | |
| Item (56), References Cited, U.S. Patent Documents | [Omitted references] | --5,463,337  10/1995  Leonowich<br><br>5,712,883  1/1998  Miller<br><br>5,764,092  6/1998  Wada et al.<br><br>6,125,157  9/2000  Donnelly-- |
| On Title page | | |
| Item (56), References Cited, Other Publications, Chapman Reference | "Ppaer 21.2," | --Paper 21.2,-- |
| Item (56), References Cited, Other Publications, von Kaenel Reference | "Nov. 1996, pp .1715-1722." | --Nov. 1996, pp. 1715-1722.-- |
| Column 1, Line 13 | "must tightly controlled" | --must be tightly controlled-- |
| Column 1, Line 25 | "specified clock edge" | --specified clock edge,-- |
| Column 1, Line 30 | "propogation of delays." | --propogation delays.-- |

UNITED STATES PATENT AND TRADEMARK OFFICE
CERTIFICATE OF CORRECTION

PATENT NO. : 6,912,680 B1
APPLICATION NO. : 08/798227
DATED : June 28, 2005
INVENTOR(S) : Brent Keeth It is certified that error appears in the above-identified patent and that said Letters Patent is hereby corrected as shown below:

| Column, Line | Reads | Should Read |
|---|---|---|
| Column 2, Line 7 | "versions of the maser clock" | --versions of the master clock-- |
| Column 3, Line 13 | "with edges the" | --with edges of the-- |
| Column 4, Line 30 | "and fine venires 96" | --and fine verniers 96-- |
| Column 5, Line 63 | "timing in not excessive," | --timing is not excessive,-- |
| Column 6, Line 4 | "the new course" | --the new coarse-- |
| Column 6, Line 40 | "output timing:" | --output timing comprises:-- |
| Column 7, Line 15 | "time delay adjusting" | --time delay comprises adjusting-- |
| Column 7, Line 45 | "comparator:" | --comparator comprises:-- |
| Column 7, Line 49 | "a pluarlity of phase comparator," | --a plurality of phase comparators,-- |

UNITED STATES PATENT AND TRADEMARK OFFICE
CERTIFICATE OF CORRECTION

PATENT NO. : 6,912,680 B1
APPLICATION NO. : 08/798227
DATED : June 28, 2005
INVENTOR(S) : Brent Keeth It is certified that error appears in the above-identified patent and that said Letters Patent is hereby corrected as shown below:

| Column, Line | Reads | Should Read |
|---|---|---|
| Column 8, Line 19 | "a pluarlity of phase comparator," | --a plurality of phase comparators,-- |

Signed and Sealed this

Twenty-ninth Day of May, 2007

JON W. DUDAS
*Director of the United States Patent and Trademark Office*